United States Patent [19]
Gardner et al.

[11] Patent Number: 5,899,732
[45] Date of Patent: May 4, 1999

[54] METHOD OF IMPLANTING SILICON THROUGH A POLYSILICON GATE FOR PUNCHTHROUGH CONTROL OF A SEMICONDUCTOR DEVICE

[75] Inventors: Mark I. Gardner, Cedar Creek; Derick J. Wristers, Austin; Robert Dawson, Austin; H. Jim Fulford, Jr., Austin; Frederick N. Hause, Austin; Mark W. Michael, Cedar Park; Bradley T. Moore, Austin, all of Tex.

[73] Assignee: Advanced Micro Devices, Inc., Sunnyvale, Calif.

[21] Appl. No.: 08/837,937

[22] Filed: Apr. 11, 1997

[51] Int. Cl.$^6$ .................................................. H01L 21/265
[52] U.S. Cl. .......................................... 438/473; 438/528
[58] Field of Search ..................................... 438/162, 301, 438/305, 306, 307, 217, 228, 231, 143, 310, 471, 473, 528, 527, 529, 530

[56] References Cited

U.S. PATENT DOCUMENTS

| | | | |
|---|---|---|---|
| 4,728,619 | 3/1988 | Pfiester et al. | 438/228 |
| 5,420,055 | 5/1995 | Vu et al. | 438/162 |
| 5,445,975 | 8/1995 | Gardner et al. | 438/471 |
| 5,470,794 | 11/1995 | Antum et al. | 438/528 |
| 5,561,072 | 10/1996 | Saito | 438/528 |
| 5,602,045 | 2/1997 | Kimura | 438/528 |
| 5,654,209 | 8/1997 | Kato | 438/528 |
| 5,670,391 | 9/1997 | Lim et al. | 438/528 |
| 5,750,435 | 5/1998 | Pan | 438/528 |
| 5,753,560 | 5/1998 | Hong et al. | 428/473 |
| 5,770,485 | 6/1998 | Gardner et al. | 438/528 |
| 5,789,310 | 8/1998 | Pramanick et al. | 438/528 |

OTHER PUBLICATIONS

Silicon Processing For The VLSI Era—vol. 1: Process Technology, by S. Wolf, published by Lattice Press, Sunset Beach, CA, 1986, pp. 182–327.

Silicon Processing For The VLSI Era—vol. 2: Process Integration, by S. Wolf, published by Lattice Press, Sunset Beach, CA, 1990, pp. 124–131.

*Primary Examiner*—John F. Nielbling
*Assistant Examiner*—S. Mulpuri
*Attorney, Agent, or Firm*—Skjerven, Morrill, MacPherson, Franklin & Friel LLP; Ken J. Koestner

[57] ABSTRACT

A region of damaged silicon is exploited as a gettering region for gettering impurities in a silicon substrate. The region of damaged silicon is formed between source and drain regions of a device by implanting silicon atoms into the silicon substrate after the formation of a gate electrode of the device. The damaged region is subsequently annealed and, during the annealing process, dopant atoms such as boron segregate to the region, locally increasing the dopant concentration in the region. The previously damaged region is in a location that determine the punchthrough characteristics of the device. The silicon implant for creating a gettering effect is performed after gate formation so that the region immediately beneath the junction is maintained at a lower dopant concentration to reduce junction capacitance. Silicon is implanted in the vicinity of a polysilicon gate to induce transient-enhanced diffusion (TED) of dopant atoms such as boron or phosphorus for control of punchthrough characteristics of a device. A punchthrough control implant is performed following formation of gate electrodes on a substrate using a self-aligned gettering implant.

8 Claims, 4 Drawing Sheets

METHOD OF IMPLANTING SILICON THROUGH A POLYSILICON GATE FOR PUNCHTHROUGH CONTROL OF A SEMICONDUCTOR DEVICE

BACKGROUND OF THE INVENTION

1. Field of the Invention

The present invention relates to a process of a semiconductor fabrication system and for controlling the distribution of dopants or impurities in a device. More specifically, the present invention relates to a technique for controlling punchthrough in a semiconductor device using transient-enhanced diffusion.

2. Description of the Related Art

Punchthrough is a phenomenon associated with merging of source and drain depletion regions in a short-channel device. As the device channel is reduced in size, the distance between depletion regions falls. Punchthrough occurs when the channel length is reduced to approximately the sum of two depletion widths. Punchthrough occurs when the gate voltage is lower than the threshold voltage $V_T$ and occurs as a result of widening of the drain depletion region when the reverse-bias voltage on the drain is increased. Punchthrough occurs if the electric field of the drain eventually penetrates into the source region and reduces the potential energy barrier of the source-to-body junction. The majority carriers in the source region increase in energy sufficiently to overcome the potential energy barrier and an increase current flows from the source to the body. Punchthrough is suppressed by limiting the total width of the two depletion regions to less than the channel length.

Subsurface punchthrough is a phenomenon occurring in submicron N-channel MOSFETs arising from a threshold voltage $V_T$ adjust implant for raising the doping of surface channel region above the lighter doping of the substrate. The implant causes narrowing of the source/drain depletion regions near the surface but does not help in the region beneath the surface of the substrate due to lighter doping beneath the surface. Accordingly, punchthrough first occurs in the subsurface region. One technique for preventing subsurface punchthrough is to increase the substrate doping, thereby decreasing depletion layer widths. A second technique for preventing subsurface punchthrough is implantation of a punchthrough stop implant at a depth near the bottom of the source-drain regions. The punchthrough stop implant reduces the lateral widening of the drain-depletion region below the surface without increasing the doping under the junction regions. The punchthrough stop implant is effective if the placement and dosage is tightly controlled and the punchthrough implant profile is prevented from spreading appreciably during annealing. A third technique for preventing subsurface punchthrough involves local implanting of substrate-type dopants under the lightly-doped tip region of the LDD in a "halo"-type implant. The halo implant raises the dopant concentration only on the inside walls of the source/drain junctions so that the depletion length is decreased without usage of a higher-doped substrate.

Conductive regions of N-type and P-type conductivities and N-P junctions at the boundaries of conductive regions are essential for providing electrical functionality of semiconductor devices and for determining operational characteristics such as punchthrough susceptibility. The conductive regions and junctions are formed in a semiconductor wafer by diffusion or ion implantation techniques. The N-P and P-N junctions in a semiconductor substrate form structures that provide the electrical functionality of transistors and diodes. A junction is a separation between a region called an N-type region having a high concentration of negative electrons and a region called a P-type region having a high concentration of holes. A junction is typically formed in a semiconductor wafer by thermal diffusion, or ion implantation and annealing.

The structure and concentrations of dopants and impurities in the substrate determine the punchthrough performance of a device. What is needed is a technique for implanting and diffusing dopants and impurities that improves the punchthrough susceptibility of semiconductor devices.

SUMMARY OF THE INVENTION

In accordance with an embodiment of the present invention, a region of damaged silicon is exploited as a gettering region for gettering impurities in a silicon substrate. The region of damaged silicon is formed between source and drain regions of a device by implanting silicon atoms into the silicon substrate after the formation of a gate electrode of the device. The damaged region is subsequently annealed and, during the annealing process, dopant atoms such as boron segregate to the region, locally increasing the dopant concentration in the region. The previously damaged region is in a location that determine the punchthrough characteristics of the device. The silicon implant for creating a gettering effect is performed after gate formation so that the region immediately beneath the junction is maintained at a lower dopant concentration to reduce junction capacitance.

In accordance with an embodiment of the present invention, silicon is implanted in the vicinity of a polysilicon gate to induce transient-enhanced diffusion (TED) of dopant atoms such as boron or phosphorus for control of punchthrough characteristics of a device.

In accordance with an embodiment of the present invention, a punchthrough control implant is performed following formation of gate electrodes on a substrate.

In accordance with an embodiment of the present invention, a punchthrough control implant is performed following formation of gate electrodes on a substrate using a self-aligned gettering implant.

The described semiconductor processing method has many advantages. One advantage is that punchthrough control of an integrated circuit is achieved. Another advantage is that the junction capacitance is reduced. The punchthrough control implant is performed following formation of gate electrodes to advantageously concentrate the damaged silicon region in the silicon substrate at the edges of the gate electrodes. Implanting of the silicon atoms into the silicon substrate advantageously sharpens the dopant profile of the punchthrough control implant. The gettering implant, such as a silicon implant, in combination with a dopant implant and followed by a short RTA process results in a transient-enhanced diffusion to direct the form of the dopant profile to advantageously achieve a tighter distribution of the dopant at desirable regions of the silicon substrate. The dopant profiles are controlled to precisely control the form and concentration of dopants in junction regions beneath an isolation structure such as a field oxide isolation structure to reduce the capacitance of the junction. Transient-enhanced diffusion improves the doping of a substrate by enhancing the diffusion of dopants at relatively low anneal temperatures.

BRIEF DESCRIPTION OF THE DRAWINGS

The features of the described embodiments believed to be novel are specifically set forth in the appended claims.

However, embodiments of the invention relating to both structure and method of operation, may best be understood by referring to the following description and accompanying drawings.

DESCRIPTION OF THE ILLUSTRATIVE EMBODIMENT(S)

Diffusion is a process of introducing selected impurity atoms into designated areas of a semiconductor substrate to modify the electrical properties of the designated areas. The diffusion process involves heating the semiconductor substrate to a predetermined temperature in a gaseous atmosphere of the selected impurity. Impurity atoms condense on the semiconductor substrate surface and diffuse into the substrate in vertical and horizontal directions. Diffusion takes place by movement of an ion species as a result of a chemical gradient. Integrated circuit processing commonly uses diffusion of controlled impurities or dopants into silicon to achieve p-n junction formation and device fabrication. Diffusion phenomena at the atomic scale are driven by multiple mechanisms depending on interactions between atoms in the substrate crystalline lattice. Impurity atoms that only bond weakly to silicon (Si) atoms are located exclusively in the interstices of the lattice and move directly between the interstices, although oxygen atoms that bond strongly with silicon atoms also move in the lattice interstices. In contrast, substitutional impurities and self-diffusing silicon atoms do not primarily diffuse interstitially but predominantly diffuse in the presence of vacancies, also called point defects, in the lattice. The rate of diffusion is controlled by the combined effects of silicon vacancies and silicon interstitials, particularly for temperatures above 1000° C. Various operations either retard or enhance diffusion. For example, oxidation of silicon both enhances and retards diffusion, probably due to the oxidative injection of interstitials into the silicon lattice.

Ion implantation creates crystalline defects and impurities by bombarding energized ions into the silicon substrate lattice. When the energized ions strike the silicon substrate, energy is lost from the ions in a series of nuclear and electronic collisions and the ions come to rest hundreds of layers of atoms beneath the substrate surface. The nuclear collisions result in displaced silicon atoms which are also called damage or disorder. The damage resulting from ion implantation forms a variety of damage configurations including essentially crystalline silicon with isolated point defects or point defect clusters, local zones of completely amorphous material in an otherwise crystalline layer, and continuous amorphous layers which form as the damage from the ions accumulates. Regardless of the form of the damage configuration, the number of displaced atoms after implant is almost always larger than the number of implanted atoms. The displaced atoms reduce mobility in the damaged regions and produce defect levels in the band gap of the material which have a strong tendency to capture free carriers from the conduction and valence bands.

Figure 1A:
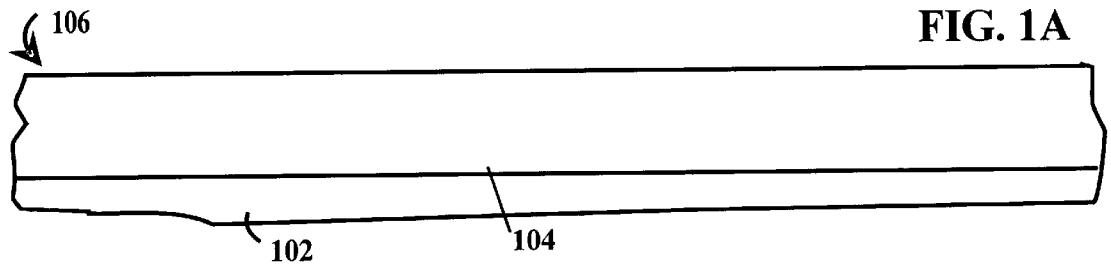
FIGS. 1A through 1M depict a series of cross-sectional views of a semiconductor wafer illustrating steps of a method for fabricating a device using silicon implantation through a polysilicon gate to control device punchthrough by transient-enhanced diffusion in accordance with an embodiment of the present invention.

Referring to FIG. 1A, NMOS devices are formed in a lightly doped P-substrate having a P-type impurity concentration of less than approximately $10^{15}/cm^3$ and PMOS devices are formed in a more heavily-doped N-type substrate having an impurity concentration of about $10^{16}/cm^3$. The starting material is typically a heavily-doped <100>-orientation silicon substrate 102 upon which a thin (2 $\mu$m to 10 $\mu$m) lightly-doped epitaxial layer 104 is grown. Either an n-epi-on-n$^+$or a p-epi-on-p$^+$substrate may be used. The a p-epi-on-p$^+$substrate is more typically used due to a lesser sensitivity to process-induced defects.

Figure 1B:
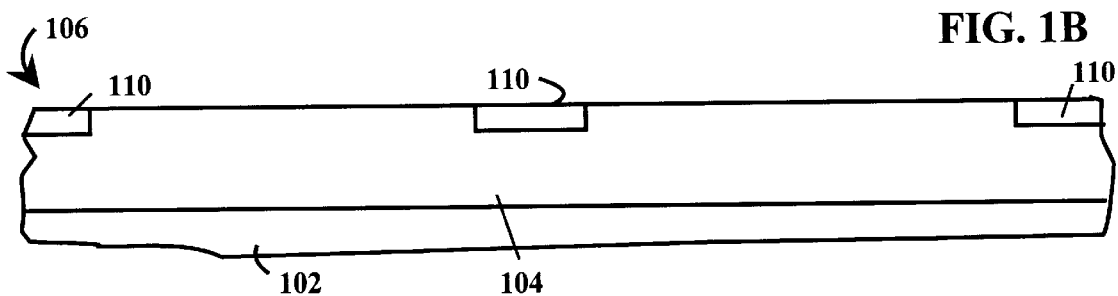

Referring to FIG. 1B, field oxide isolation 110 is formed in the silicon substrate 102. In the illustrative embodiment, the field oxide isolation 110 is formed using trench isolation. Trench isolation is used to improve transistor packing density without the encroachment of a LOCOS isolation scheme. Trench isolation advantageously reduces latchup for processes employing a thin epitaxial layer overlying a heavily-doped substrate.

Figure 1C:
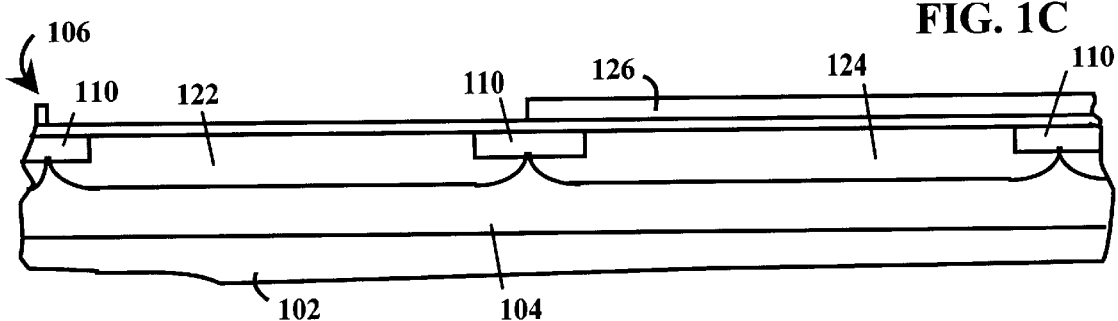

Referring to FIG. 1C, N-wells 122 and P-wells 124 are formed in the silicon substrate 102 so that both n-channel and p-channel transistors can be fabricated in the same wafer in CMOS technologies. N-wells 122 and P-wells 124 are regions of opposite doping that are the first features defined on a silicon substrate 102. N-wells 122 and P-wells 124 are formed by implanting and diffusing appropriate dopants, for example phosphorus or arsenic for N-wells 122 and boron for P-wells 124 to attain a suitable well depth and doping profile. The twin wells may be formed using various techniques. In one example, the two wells are formed using two masking steps, each of which blocks one of the well implants.

In the single-mask process, a single mask 126 is applied to pattern a nitride/oxide film formed on the bare surface of the silicon substrate 102. Openings in the mask 126 form the N-well 122 regions upon implantation of phosphorus, for example at an implant energy of about 80 keV. Thermal oxide is grown on the N-well 122 regions to a thickness that is sufficient to block a boron implant subsequently used to form the P-wells 124. The oxide/nitride layer is stripped, exposing the silicon in the P-well 124 regions, while the N-wells 122 are covered with the implant-blocking oxide layer so that a boron P-well implant at an implant energy of approximately 50 keV penetrates the silicon only in suitable regions.

The N-wells 122 and the P-wells,124 are annealed or "driven-in" for example at a temperature of 1000° C. for 180–200 min. Following the anneal step, the concentration in the wells is suitable for subsequent processing. In one example, a 0.3$\mu$cm CMOS process, a suitable P-well concentration is about $10^{16}/cm^3$ and a suitable N-well concentration is about $3 \times 10^{16}/cm^3$. The higher doping concentration of the N-well improves punchthrough performance of PMOS devices and eliminates a need for separate channel-stop steps for the N-well process.

Typically, a channel-stop procedure is included in the process sequence for forming the wells. Various procedures are used to form channel-stop implants. In one embodiment, a single P-well channel-stop implant of boron is used since doping in the N-well is generally sufficient that a second channel-stop is not necessary. Alternatively, separate channel-stop implants may be implemented for the P-wells and the N-wells. In this process, boron is implanted into both the P-wells and the N-wells so that a phosphorus channel-stop implant is increased to compensate for the boron implant of the N-well regions. Also alternatively, a maskless channel-stop procedure is used in which both boron and phosphorus are implanted into the N-well regions, placing both dopants that form the well and the dopants forming the channel-stop into the N-well regions prior to implanting of the P-wells. An oxide is then grown on the N-well regions and the boron implant for the P-wells is implanted. The N-wells 122 are annealed, the oxide layer overlying the N-wells is retained, and a second boron implant is performed, serving both as a channel-stop implant in the P-well field regions and a punchthrough prevention implant in the active regions of the P-wells 124.

In the twin-well CMOS, for example, separate P-wells 124 are formed for N-channel transistors and N-wells 122 are formed for P-channel transistors. The silicon substrate 102 is either a lightly doped wafer of N or P type material or a thin, lightly doped epitaxial layer on a heavily doped substrate. The level of surface doping is significantly lower than doping for either N-channel or P-channel transistor formation. The N-type well dopants and P-type well dopants are implanted separately into the lightly doped surface region of the silicon substrate 102 and annealed into the silicon substrate 102 a desired depth.

PMOS devices with boron ions for adjusting threshold voltage $V_T$ are susceptible to punchthrough effects since the boron implant forms a p-layer with a finite thickness, moving the potential minimum in the channel away from the silicon-oxide interface at the surface of the silicon wafer 106. Such "buried-channel" transistors have a potential minimum that moves further into the substrate as the thickness of the implanted p-layer is increased. As the potential minimum is moved deeper below the surface, the punchthrough susceptibility increases, as well as problems resulting from leakage currents. The problem of punchthrough is addressed by increasing the channel length, and by reducing the thickness of the buried p-type layer. The p-layer thickness is conventionally reduced by implanting the p-layer with $BF_2$ which produces more shallow boron layers than a boron implant. The p-layer thickness is also reduced by using a high-energy n-type implant to place more n-type dopant atoms below the pn junctions. Boron redistribution resulting in thickening of the p-layer is restricted by implanting the boron p-layer through the gate oxide, avoiding oxidation-enhanced diffusion of boron that would occur during the growth of the gate oxide if the implant were performed first. Following the p-layer implant, polysilicon film is deposited and doped during the deposition step in situ with phosphorus to avoid a subsequent phosphorus doping thermal cycle that would diffuse the boron and thicken the p-layer.

Figure 1D:
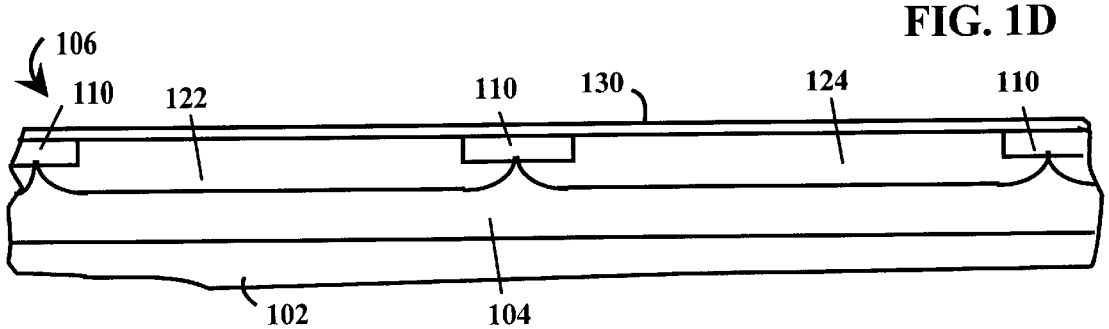

Referring to FIG. 1D, a gate oxide layer 130, is grown overlying the silicon substrate 102 and the threshold voltage $V_T$ of both enhancement mode and depletion mode transistors are adjusted using ion implantation. The gate oxide layer 130 is free of defects, thin in a range from 3.0 nm to 20 nm, a high-quality oxide, and contamination-free. The gate oxide layer 130 is grown only in exposed active regions of the silicon substrate 102. The gate oxide layer 130 is formed as thin as possible to increase drain current, but formed sufficiently thick to avoid oxide breakdown and attain reliable operation.

Ion implantation is used to set threshold voltage $V_T$, advantageously allowing the threshold voltage $V_T$ to be set independently of substrate doping, allowing substrate doping to be set on the basis of device performance alone.

Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

Threshold adjustment implants and punchthrough implants may be performed either before or after gate-oxide growth. In conventional devices, the threshold voltage $V_T$ adjustment implant is injected through the gate oxide layer or a sacrificial oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted through the gate oxide layer 130 at a concentration in a range from approximately $10^{12}$ to $10^{13}$ atoms/$cm^2$ and an energy in the range from about 50 keV to 100 keV, an energy insufficient to penetrate the field oxide isolation 110.

A threshold voltage $V_T$ adjustment implant for depletion-mode devices is performed by implanting areas of depletion-mode devices with phosphorus or arsenic atoms at a concentration of about $10^{12}$ to $10^{13}$ atoms/$cm^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

Figure 1E:
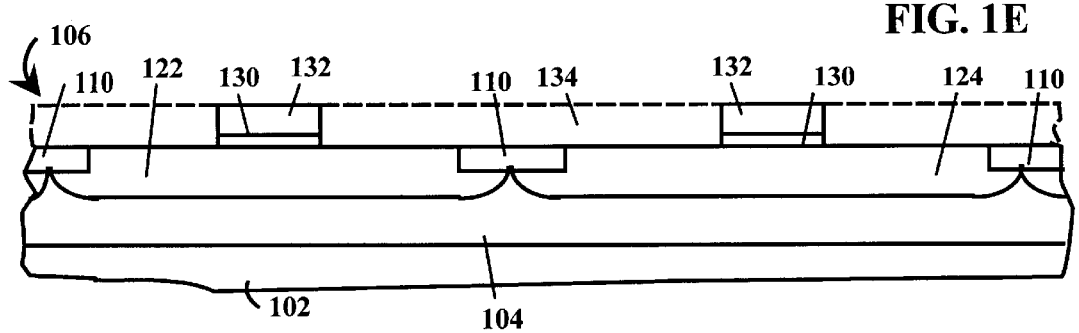

Referring to FIG. 1E, gate electrodes 132 are formed by polysilicon deposition and patterning. A layer of polysilicon 134 is deposited by chemical vapor deposition (CVD) overlying the entire silicon wafer 106. A suitable sheet resistance is formed. In some embodiments, the layer of polysilicon 134 is doped by ion implantation or diffusion. In other embodiments, composite polycide layers of refractory metal silicides and polysilicon are formed. In still other embodiments, self-aligned silicided gate and source/drain regions for formed using a salicide process to reduce parasitic resistance of the source and drain regions, and the gate material.

The gate electrodes 132 and polysilicon interconnect structures (not shown) are patterned and etched using a photoresist mask to form a gate-length that is precisely maintained across the entire silicon wafer 106 and wafer to wafer since the drain current $I_D$ is strongly dependent on gate dimensions.

A process for enhancing the gettering of the silicon wafer 106 is employed following formation of the gate electrodes 132. A getter is used to remove undesirable elements or compounds that are present in small quantities in a substrate. The process of using a getter is called gettering. Gettering is a process of removing degrading crystalline defects and impurities introduced during crystal growth and subsequent processing from active device regions of a substrate. Ion implantation is a process that commonly creates crystalline defects and impurities. The process of gettering removes impurities from an active device region in three steps including releasing the impurities to be gettered into a solid solution from a stable precipitate form, diffusing the impurities through the silicon, and capturing the impurities by extended defects, dislocations or precipitates at a position removed from the device regions.

Two types of gettering are extrinsic and intrinsic gettering. Extrinsic gettering involves the usage of a phenomenon external to the substrate to create damage or stress in a silicon lattice, leading to the creation of extended defects or chemically reactive sites for capturing mobile impurities. Extrinsic gettering techniques include formation of mechanical damage by abrasion, grooving, or sandblasting to create stress fields at the backside of wafers. Another extrinsic gettering technique is diffusion of phosphorus. Laser-induced damage by scanning a laser beam across a substrate surface produces a gettering effect by inflicting mechanically-induced damage. Various ions including argon (Ar), phosphorus (P), arsenic (As), and boron (B) have been implanted to produce backside damage that creates a gettering effect. Extrinsic gettering is also produced by depositing a layer of polysilicon on a wafer backside with grain boundaries and a high degree of lattice disorder in polysilicon acting as a sink for impurities. Generally, extrinsic gettering processes have several limitations including a lack of stability, particularly at high temperatures.

Intrinsic gettering involves the localization of impurities at extended defects existing within a silicon wafer. Intrinsic gettering is based on a principle that supersaturated oxygen in silicon wafers precipitates out of solution and form clusters within the wafer during thermal processing under proper conditions. Stresses result as the clusters grow into larger precipitates are relieved by forming dislocations that become sites for localizing and trapping impurities. Implant damage may also produce intrinsic gettering.

Figure 1F:
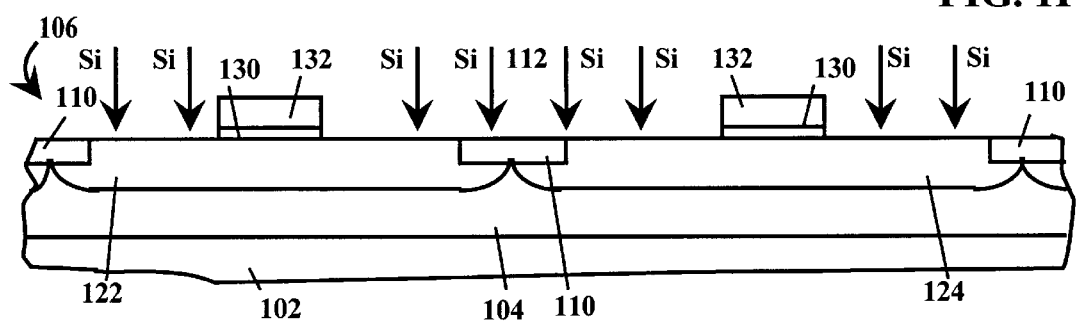

Referring to FIG. 1F, atoms are implanted in the silicon substrate 102 to form gettering regions in selected regions of the substrate in a process which may be called a "gettering implant" process. For example, in one embodiment silicon atoms 112 are implanted into a silicon substrate to act as a getter for dopant implants. In other embodiments, atoms such as germanium (Ge) atoms may be implanted as a getter for the dopant implants.

Figure 1G:
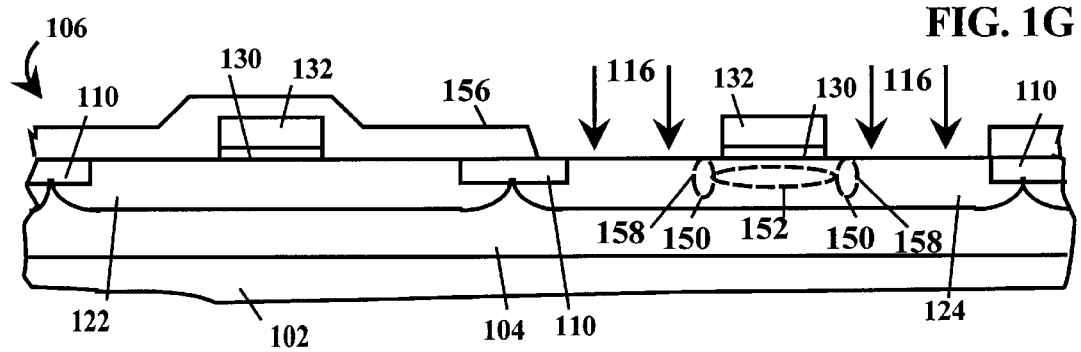

Referring to FIG. 1G, in the illustrative embodiment the silicon atoms 112 are used to attract boron atoms at P-N junction regions 150 adjoining a channel 152 beneath the gate electrode 132 to source/drain regions 138 of an N-channel MOSFET device 154. In alternative embodiments, silicon atoms 112 are used as a getter to attract both N-type ions such as phosphorous and P-type ions such as boron, thereby serving as a getter for both N and P-type MOSFET devices.

The silicon implant serves as a getter for a punchthrough control implant 116. The doping energies and time durations for implanting the gettering implant atoms is selected virtually independently among various doped regions of the silicon substrate 102 to optimize the performance of a device. The doped regions for the punchthrough control implant 116 are implanted selectively using a photoresist mask 156.

A damaged silicon region 158 is exploited as a gettering region for gettering impurities in the silicon substrate 102. The region of damaged silicon is formed between source and drain regions 138 of a device by implanting silicon atoms into the silicon substrate after the formation of a gate electrode 132 of the device. The damaged region 158 is subsequently annealed and, during the annealing process, dopant atoms such as boron segregate to the region, locally increasing the dopant concentration in the region. The previously damaged region is in a location that determines punchthrough characteristics of the device. The silicon implant 112 for creating a gettering effect is performed after gate formation so that the region immediately beneath the P-N junction region 150 is maintained at a lower dopant concentration to reduce junction capacitance.

Silicon 112 is implanted in the vicinity of the polysilicon gate electrode 132 to induce transient-enhanced diffusion (TED) of dopant atoms such as boron atoms for control of punchthrough characteristics of a device.

The punchthrough control implant 116 is performed following formation of the gate electrodes 132 to advantageously concentrate the damaged silicon region 158 in the silicon substrate 102 at the edges of the gate electrodes 132. Accordingly, the damaged silicon region 158 is self-aligned with the gate electrodes 132 and formed adjacent to the P-N junction region 150. The gate electrodes 132 advantageously protect the channel 152 from the punchthrough control implant 116 so that the channel 152 substantially avoids damage to the silicon. The silicon atoms 112 and the punchthrough control implant 116 are implanted at a sufficient implant energy to reach at depth at the lowermost region of the source/drain regions 138.

Implanting of the silicon atoms 112 into the silicon substrate 102 advantageously sharpens the dopant profile of the punchthrough control implant 116.

Typically, the dopant species is a P-type dopant species of boron for the punchthrough control implant 116. The atomic mass of the boron atoms is 11 and the atomic mass of silicon atoms is 29 so that the silicon implant is driven roughly one-third the depth into the silicon substrate 102 in comparison to the depth attained for a boron implant at the same energy. Accordingly, very high energies are generally used to implant the silicon atoms and substantially lower energies are used to implant the boron atoms. Due to the lower implant energy for the boron implant, the punchthrough control implant 116 is typically performed in situ. In contrast, the gettering silicon implant may be removed from a low energy ion implant device to a high energy implant device to perform a high energy implant.

In an alternative embodiment, both an N-type and a P-type punchthrough control implant 116 may be implanted to control punchthrough for both N-channel and P-channel MOSFET devices. For these alternative embodiments, typically the N-type dopant species is phosphorus and the P-type dopant species is boron. The atomic mass of the boron atoms is 11 and the atomic mass of the phosphorus atoms is 31 so that the N-type phosphorus implant is driven approximately one-third the depth into the silicon substrate 102 in comparison to the depth attained for a boron implant at the same energy. Accordingly, very high energies are generally used to implant the phosphorus atoms and substantially lower energies are used to implant the boron atoms.

Figure 1H:
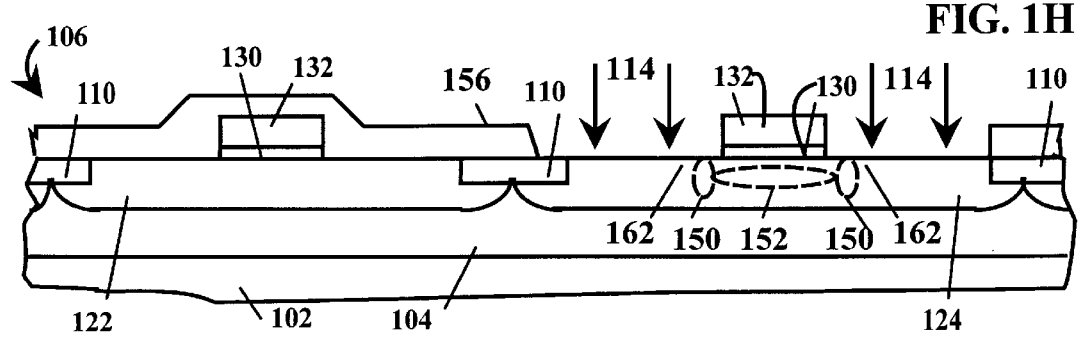

Referring to FIG. 1H, in some embodiments a threshold voltage $V_T$-adjustment implant 114 is performed as an implant that is self-aligned to the gate electrodes 132 in addition to the punchthrough control implant 116. (In other embodiments, the $V_T$-adjustment implant 114 may be performed and the punchthrough control implant 116 omitted). The silicon implant serves as a getter for the $V_T$-adjustment implant 114. The doping energies and doses for implanting the gettering implant atoms is selected virtually independently among various doped regions of the silicon substrate 102 to optimize the performance of a device. The doped regions for the $V_T$-adjustment implant 114 are implanted selectively using a photoresist mask 156.

A damaged silicon region 162 is exploited as a gettering region for gettering impurities in the silicon substrate 102. The region of damaged silicon is formed between source and drain regions 138 of a device by implanting silicon atoms into the silicon substrate after the formation of a gate electrode 132 of the device. The damaged region 162 is subsequently annealed and, during the annealing process, dopant atoms such as boron segregate to the region, locally increasing the dopant concentration in the region.

Figure 1I:
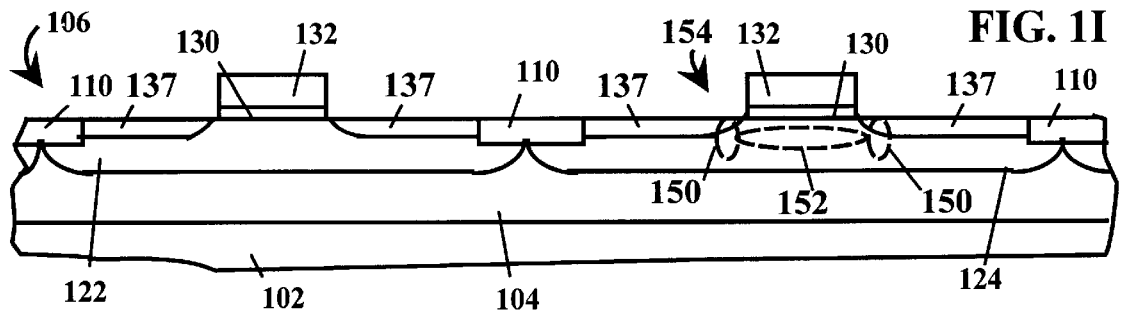

Referring to FIG. 1I, lightly-doped drain (LDD) regions 137 of a device such as a P-channel MOSFET device 154 are formed by ion implantation. In advanced CMOS processes, gate lengths are sufficiently short that lightly doped drain (LDD) structures are used to minimize hot-electron effects. LDD structures are used to absorb potential into the drain and thereby reduce the maximum electric field $E_M$ in a device. An LDD structure is formed using two implants, one which is self-aligned to the gate electrode and the second which is self-aligned to the gate electrode extended by two oxide sidewall spacers. The first implant is a lighter dose and forms a lightly doped section of the drain at the edge of the gate electrode near the channel. The value of maximum electric field $E_M$ is reduced since the voltage drop is shared by the drain and the channel. The second implant is a heavier dose, forms a low resistivity region of the drain region, and is merged with the lightly doped region to prevent asymmetric drain current $I_D$ characteristics and to prevent variation of channel lengths by penetration of ions of thinner regions of gate sidewalls during formation of source/drain regions by ion implantation. Separate masks are applied to selectively implant the sources and drains of the two transistor types. If LDD structures are used for PMOS devices, two additional masking steps are applied.

The punchthrough control implant 116 is implanted either before or following the implanting of the source/drain regions 138. Punchthrough is addressed by increasing the channel length and reducing the thickness of the buried p-type layer using the punchthrough control implant 116. The punchthrough control implant 116 is implanted at a concentration of from approximately $10^{15}/cm^3$ to $1 \times 10^{17}/cm^3$ to inhibit current flow beneath a device channel. The p-layer thickness is conventionally reduced by implanting the p-layer with $BF_2$ which produces more shallow boron layers than a boron implant. The p-layer thickness is also reduced by using a high-energy n-type implant to place more n-type dopant atoms below the pn junctions. Boron redistribution resulting in thickening of the p-layer is restricted by implanting the boron p-layer through the gate oxide, avoiding oxidation-enhanced diffusion of boron that would occur during the growth of the gate oxide if the implant were performed first. Following the p-layer implant, polysilicon film is deposited and doped during the deposition step in situ with phosphorus to avoid a subsequent phosphorus doping thermal cycle that would diffuse the boron and thicken the p-layer. In one embodiment, the punchthrough control implant 116 is implanted at an energy of approximately 60 keV for a boron P-type implant and about 140–150 keV for the silicon atoms 112 gettering implant. In embodiments in which punchthrough control is applied to both N-channel and P-channel devices, a phosphorus N-type punchthrough control implant 116 is applied at an implant energy of about 160 keV. The silicon gettering implant for both the P-type and N-type dopants is implanted at an energy of approximately 140–150 keV. In other embodiments, different implant energies may be applied. A suitable range of boron punchthrough prevention energies extends from approximately 30 keV to about 125 keV. A suitable range of phosphorus punchthrough prevention energies extends from approximately 80 keV to 330 keV. A suitable range of silicon punchthrough prevention energies extends from approximately 75 keV to about 300 keV.

The $V_T$-adjustment implant 114 is performed either before or following the implanting of the source/drain regions 138 either before or after the punchthrough control implant 116 or prior to gate growth. The $V_T$-adjustment implant 114 is implanted self-aligned to the gate electrodes 132, near to the substrate surface, and extending only a predetermined shallow depth into the substrate, substantially more shallow than the punchthrough control implant 116. PMOS devices with boron ions for adjusting threshold voltage $V_T$ are susceptible to punchthrough effects since the boron implant forms a p-layer with a finite thickness, moving the potential minimum in the channel away from the silicon-oxide interface at the surface of the silicon wafer 106. Such "buried-channel" transistors have a potential minimum that moves further into the substrate as the thickness of the implanted p-layer is increased. As the potential minimum is moved deeper below the surface, the punchthrough susceptibility increases, as well as problems resulting from leakage currents. In one embodiment, the $V_T$-adjustment implant 114 is implanted at an energy of approximately 25 keV for a boron P-type implant and about 70 keV for a phosphorus N-type implant. A silicon gettering implant for the P-type and N-type dopants is implanted at an energy of approximately 60–65 keV. In other embodiments, different implant energies may be applied. A suitable range of boron $V_T$ adjusting energies extends from approximately 10 keV to about 30 keV. A suitable range of phosphorus $V_T$ adjusting energies extends from approximately 25 keV to 85 keV. A suitable range of silicon $V_T$ adjusting energies extends from approximately 25 keV to about 75 keV.

Figure 1J:
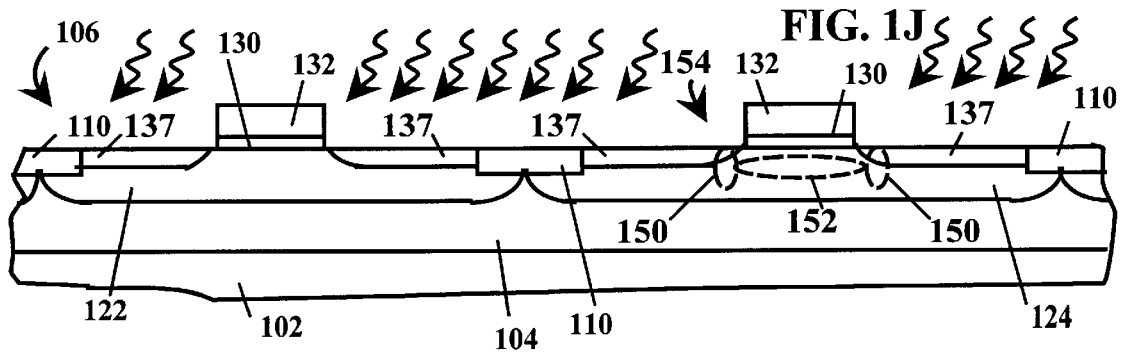

Referring to FIG. 1J, the punchthrough control implant 116 and, if implemented, the $V_T$-adjustment implant 114, are "driven-in" by a thermal annealing process. In one embodiment, a short rapid thermal anneal (RTA) process is performed following the gettering and dopant implants to enhance the migration of dopants to a region positioned by the selected peak gettering implant location. The gettering implant, such as a silicon implant, in combination with a dopant implant and followed by a short RTA process results in a transient-enhanced diffusion to direct the form of the dopant profile to advantageously achieve a tighter distribution of the dopant at desirable regions of the silicon substrate 102. Using this method, transient-enhanced diffusion directs the migration of dopant atoms to locations that advantageously improve junction control and implant depth control. In the illustrative embodiment, transient-enhanced diffusion is performed to advantageously adjust the dopant profiles of the $V_T$-adjustment implant 114 and the punchthrough control implant 116 for both N-type dopants and P-type dopants. More specifically, the dopant profiles are controlled to precisely control the form and concentration of dopants in junction regions beneath an isolation structure such as a field oxide isolation structure to advantageously reduce the capacitance of the junction. Transient-enhanced diffusion improves the doping of a substrate by enhancing the diffusion of dopants at relatively low anneal temperatures.

The self-aligned punchthrough control implant 116 following annealing follows a contour at the P-N junction region 150 between the channel 152 and the source/drain regions 138, forming a substantially gaussian profile of dopant concentration centered near the edge of the gate electrodes 132. By using the gate electrodes 132 to self-align the punchthrough control implants 116, the gate electrodes 132 serve as a natural grating of forming a profile of implants that directly contact the devices.

Heavily-doped regions typically have a greater number of impurities than less-doped regions. Thus, the ions from the doped regions of the source/drain regions 138 and the LDD implants are drawn the damaged silicon regions 158 during thermal processing, simultaneously and advantageously removing contaminants from the doped regions and improving punchthrough susceptibility. Conventional processes are limited in that no good technique previously exists for focusing dopants or impurities at the edge of a gate electrode to improve punchthrough resistance.

In some embodiments, the gettering and transient-enhanced diffusion processes are performed not only after the formation of gate electrodes 132 but also prior to gate formation using a technique described in related U.S. patent application Ser. No. 08/837,936, entitled "Method of Controlling Dopant Concentrations using Transient-Enhanced Diffusion Prior to Gate Formation in a Device", Gardner M.I., et al., (Attorney Docket No. M-3961 US), filed on the same day as the present patent application, which is hereby incorporated by reference in its entirety.

Figure 1K:
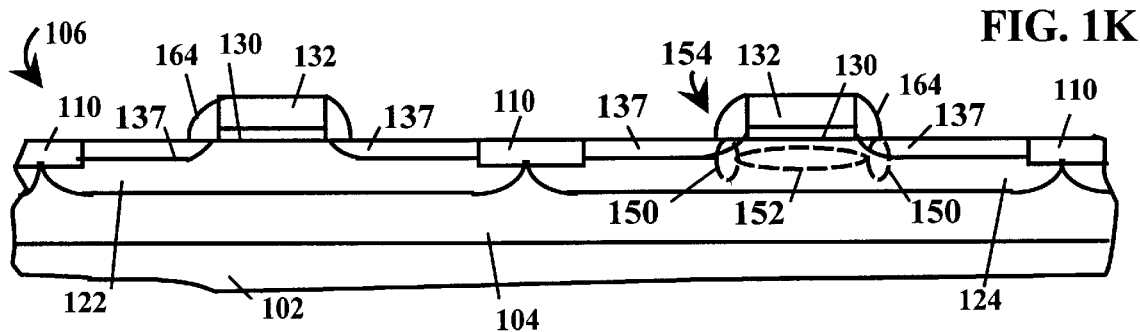

Referring to FIG. 1K, gate sidewalls 164 are formed on the sides of the gate electrodes 132 by conventional processes including deposition of a polysilicon layer, silicon dioxide, silicon nitride, or the like and isotropic etching.

Figure 1L:
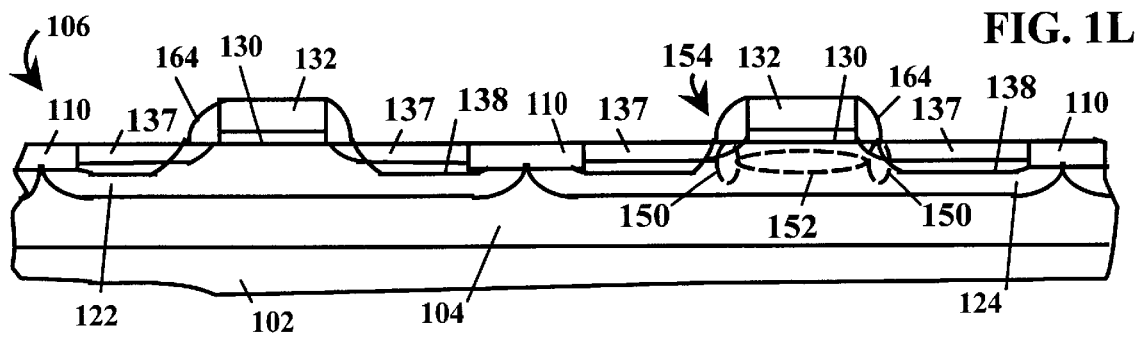

Referring to FIG. 1L, source/drain regions 138 of a given type are formed by ion implantation without usage of a lithography process. The gate electrodes 132 and the field oxide isolation 110 act as masks to prevent ion implantation from penetrating to underlying regions of the silicon substrate 102, a process called a "self-aligned" implant. Following the source/drain implant, an anneal process is used to activate implanted atoms and to position the source/drain junctions in suitable locations.

Several techniques are alternatively performed to form shallow source/drain junctions for submicron CMOS devices. In one example, arsenic is implanted for N-channel devices and $BF_2^+$ is implanted for P-channel devices since both species have shallow ranges at typical implant energies of 30 keV to 50 keV implanted through a screen oxide to protect source-drain regions from implant contamination. The silicon substrate 102 is preamorphized by implanting silicon (Si) or germanium (Ge) to reduce channeling and produce shallow junctions. The implanted species is diffused past the layer of implant damage that is not annealed out to prevent junction leakage. Rapid thermal anneal techniques are used to perform the anneal and diffusion thermal cycles. Shallow $p^+n$ junctions formed using diffusion is also used. The screen oxide is damaged and often contaminated following the source-drain implant and is therefore stripped following the source-drain implant. Another oxide layer is grown over the source-drain regions and on the sidewall of the etched polysilicon gate electrode 132 in a polysilicon reoxidation step.

A thermal anneal cycle is performed to repair some of the implantation damage. Oxide formed on the polysilicon sidewall shifts the remaining damage away from the edge of the gate electrode 132 to maintain the integrity of the thin gate oxide. The sidewall oxidation creates a gate bird's beak under the polysilicon edge, reducing the gate-to-drain overlap capacitance and relieving the electric field intensity at the corner of the gate structure.

Figure 1M:
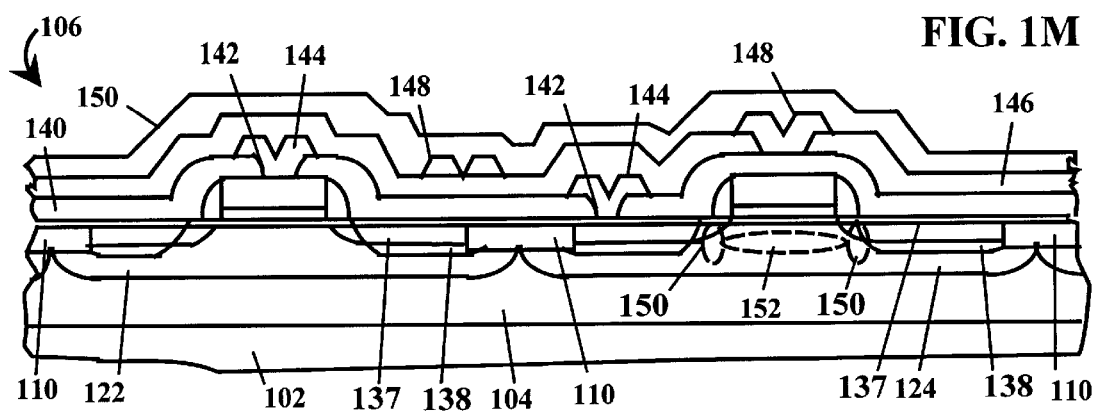

Referring to FIG. 1M, a chemical vapor deposition (CVD) oxide ($SiO_2$) 140 is deposited, typically to a depth of approximately 1 $\mu$m, and contacts are formed following formation of the source-drain region. The CVD oxide layer 140 may be doped with phosphorus or phosphorus and boron. The CVD oxide layer 140 serves as an insulator between the layer of polysilicon 134 and subsequently-deposited metal layers, reduces the parasitic capacitance of a subsequently-formed interconnect metalization layer, and serves as a getter of sodium ions to stabilize the threshold voltage $V_T$ of a device. After the CVD oxide layer 140 is deposited, the silicon wafer 106 is chemical-mechanically polished (CMP) to planarize the surface. Contact openings 142 are formed by lithographic patterning and etching using a photoresist mask and a dry-etch process to uncover the contact openings 142 through the CVD oxide layer 140 to the underlying layer of polysilicon 134 and doped regions of the silicon substrate 102. The contact openings 142 allow electrical connections between subsequently formed metal layers and the source/drain, gate, and substrate and well contact regions. A first metal layer 144 which is typically titanium and titanium nitride is deposited, followed by deposition of a tungsten layer. This structure is chemical-mechanically polished (CMP) to fill the contact holes. A layer of metal is then sputtered on the surface, patterned using a mask, and etched. An intermetal dielectric layer 146 is deposited to electrically isolate the first metal layer 144 from subsequently-formed metal layers. The intermetal dielectric layer 146 is planarized and vias are formed in the intermetal dielectric layer 146 to supply interconnections between metal layers. A second metal layer 148 is deposited and patterned overlying the intermetal dielectric layer 146. A passivation layer 149 is deposited and patterned overlying the second metal layer 148.

While the invention has been described with reference to various embodiments, it will be understood that these embodiments are illustrative and that the scope of the invention is not limited to them. Many variations, modifications, additions and improvements of the embodiments described are possible. For example, transient-enhanced diffusion may be also employed to enhance the dopant concentration in the channel such as to improve threshold voltage $V_T$ performance, punchthrough control and well formation. Also, transient-enhanced diffusion may be also employed to enhance the dopant concentration at the base of an isolation structure such as a trench, field oxide or LOCOS isolation. For example, in one process for forming a trench isolation structure, a low energy implant may be performed upon the etching of the trench so that the dopant concentration is increased at the base of the trench without usage of extra masking steps. although the illustrative example depicts a twin-well process, this is done for illustrative purposes only to fully explain the novel features of the present invention. The process is similarly applicable to P-well CMOS and N-well CMOS.

What is claimed is:

1. A method of distributing dopants into a substrate having a gate electrode formed thereon comprising the steps of:

implanting gettering atoms into a first region of the substrate that is self-aligned with the gate electrode;

implanting dopant atoms of a selected impurity species into a second region in the vicinity of the implanted gettering atoms in the substrate;

diffusing the implanted dopant atoms into the first region by transient-enhanced diffusion by thermal cycling:

further comprising:

implanting gettering atoms into a region of the substrate selected to adjust a dopant profile of a well-formation implant, a punchthrough prevention implant, and a threshold voltage $V_T$ adjusting implant for an N-type dopant:

implanting dopant atoms of a selected impurity species into the selected region of the substrate to adjust the dopant profile of the well-formation implant, the punchthrough prevention implant, and the threshold voltage $V_T$ adjusting implant for an N-type dopant:

implanting gettering atoms into a region of the substrate selected to adjust a dopant profile of a well-formation implant, a punchthrough prevention implant, and a threshold voltage $V_T$ adjusting implant for a P-type dopant: and implanting dopant atoms of a selected impurity species into the selected region of the substrate to adjust the dopant profile of the well-formation implant, the punchthrough prevention implant, and the threshold voltage $V_T$ adjusting implant for a P-type dopant.

2. A method according to claim 1 wherein:

the gettering atoms are silicon (Si) atoms.

3. A method according to claim 1 wherein:

the gettering atoms are germanium (Ge) atoms.

4. A method according to claim 1 wherein:

the gettering atoms are arsenic (As) atoms.

5. A method according to claim 1 wherein:

the gettering atoms are boron (B) atoms.

6. A method according to claim 1 wherein the step of diffusing the implanted dopant atoms further comprises the step of:

performing a short rapid thermal anneal (RTA) process following the gettering implant and the dopant implant to enhance the migration of dopants to a region positioned by the selected gettering implant region to achieve a compact distribution of the dopant at the selected gettering implant region.

7. A method according to claim 1 further comprising the steps of:

implanting silicon gettering atoms into the region of the substrate selected to adjust a dopant profile of the threshold voltage $V_T$ adjusting implant at an implant energy in a range from 25 keV to 75 keV; and implanting P-type boron dopant atoms into the region of the substrate selected to adjust a dopant profile of the threshold voltage $V_T$ adjusting implant at an implant energy in a range from 10 keV to 30 keV.

8. A method according to claim 1 further comprising the steps of:

implanting silicon gettering atoms into the region of the substrate self-aligned to the gate electrode and selected to adjust a dopant profile of the punchthrough control implant at an implant energy in a range from 75 keV to 300 keV; and implanting P-type boron dopant atoms into the region of the substrate selected to adjust a dopant profile of the punchthrough prevention implant at an implant energy in a range from 30 keV to 125 keV.

* * * * *

UNITED STATES PATENT AND TRADEMARK OFFICE
CERTIFICATE OF CORRECTION

PATENT NO. : 5,899,732
DATED : May 4, 1999
INVENTOR(S) : Mark I. Gardner, et al.

It is certified that error appears in the above-identified patent and that said Letters Patent is hereby corrected as shown below:

Column 11, line 14; please delete "(Attorney Docket No. M-3961 US),".

Signed and Sealed this

Eleventh Day of January, 2000

Attest:

Q. TODD DICKINSON

Attesting Officer

Acting Commissioner of Patents and Trademarks